/

US011086286B2

(12) United States Patent
Hirata et al.

(10) Patent No.: US 11,086,286 B2
(45) Date of Patent: Aug. 10, 2021

(54) SUBSTRATE PROCESSING SYSTEM, SUBSTRATE PROCESSING METHOD, AND CONTROL PROGRAM

(71) Applicant: Tokyo Electron Limited, Tokyo (JP)

(72) Inventors: Toshiharu Hirata, Yamanashi (JP); Yosuke Katada, Tokyo (JP); Takafumi Matsuhashi, Yamanashi (JP); Kunio Takano, Yamanashi (JP); Kouichi Nakajima, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 65 days.

(21) Appl. No.: 16/453,479

(22) Filed: Jun. 26, 2019

(65) Prior Publication Data

US 2020/0012254 A1 Jan. 9, 2020

(30) Foreign Application Priority Data

Jul. 9, 2018 (JP) .............................. JP2018-130079

(51) Int. Cl.
  *G05B 19/402* (2006.01)
  *H01L 21/677* (2006.01)
  *H01L 21/67* (2006.01)
(52) U.S. Cl.
  CPC .. *G05B 19/402* (2013.01); *G05B 2219/40066* (2013.01)
(58) Field of Classification Search
  CPC ........ G05B 19/402; G05B 2219/40066; H01L 221/67745; H01L 21/67196;

(Continued)

(56) References Cited

U.S. PATENT DOCUMENTS

2007/0219660 A1* 9/2007 Kaneko ............. H01L 21/67271
  700/100
2011/0172800 A1* 7/2011 Koizumi ................ G06Q 10/06
  700/100

FOREIGN PATENT DOCUMENTS

JP 6160614 B2 7/2017
KR 10-0363528 7/1999

(Continued)

*Primary Examiner* — Thomas C Lee
*Assistant Examiner* — Anzuman Sharmin
(74) *Attorney, Agent, or Firm* — Fenwick & West LLP

(57) ABSTRACT

A substrate processing system includes a processing unit including processing modules and a first transfer device, a loading/unloading unit including a load port holding a substrate accommodating container and a second transfer device, and a control unit. The control unit controls the substrates to be sequentially transferred. When an error has occurred in a certain processing module, the control unit executes: collecting a substrate that has been unloaded from the substrate accommodating container but has not been processed in the substrate accommodating container; continuing processing of a preceding substrate in a processing module sequentially following the processing module in which the error has occurred; retreating an error substrate processed in the process module in which the error has occurred from the processing module to a retreat position; and continuing processing of a subsequent substrate processed in a processing module sequentially preceding the processing module in which the error has occurred.

15 Claims, 11 Drawing Sheets

(58) Field of Classification Search
CPC ......... H01L 21/67173; H01L 21/67276; H01L 21/67781; H01L 21/67736
See application file for complete search history.

(56) References Cited

FOREIGN PATENT DOCUMENTS

KR     10-2006-0085590 A     7/2006
KR     10-2007-0094862 A     9/2007

\* cited by examiner

SUBSTRATE PROCESSING SYSTEM, SUBSTRATE PROCESSING METHOD, AND CONTROL PROGRAM

CROSS-REFERENCE TO RELATED APPLICATION

This application claims priority to Japanese Patent Application No. 2018-130079 filed on Jul. 9, 2018, the entire contents of which are incorporated herein by reference in its entirety.

TECHNICAL FIELD

The present disclosure relates to a substrate processing system, a substrate processing method, and a control program.

BACKGROUND

As for a substrate processing system for processing a plurality of substrates, there is suggested one that includes a plurality of processing modules for performing predetermined processing and a transfer unit for transferring substrates to the processing modules and is configured to sequentially and serially transfer the substrates to the processing modules.

SUMMARY

In view of the above, the present disclosure provides a technique that suppresses generation of defective substrates when an error has occurred during processing in a processing system for sequentially and serially transferring a plurality of substrates to a plurality of processing modules for performing predetermined processing to the substrates.

In accordance with an aspect of the present disclosure, there is provided a substrate processing system for processing a plurality of substrates, including: a processing unit including a plurality of processing modules configured to perform predetermined processing and a first transfer device configured to transfer a substrate to the processing modules; a loading/unloading unit including a load port configured to hold a substrate accommodating container accommodating a plurality of substrates and a second transfer device configured to load/unload a substrate to/from the processing unit; and a control unit configured to control the processing modules, the first transfer device, and the second transfer device, wherein the control unit is configured to control the substrates to be sequentially and serially transferred to the processing modules, and wherein, when an error has occurred in a certain processing module, the control unit executes: collecting a substrate that has been unloaded from the substrate accommodating container but has not been processed in the substrate accommodating container; continuing processing of a preceding substrate in a processing module sequentially following the processing module in which the error has occurred; retreating an error substrate processed in the process module in which the error has occurred from the processing module to a retreat position; and continuing processing of a subsequent substrate processed in a processing module sequentially preceding the processing module in which the error has occurred.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described in detail with reference to the accompanying drawings.

Figure 1:
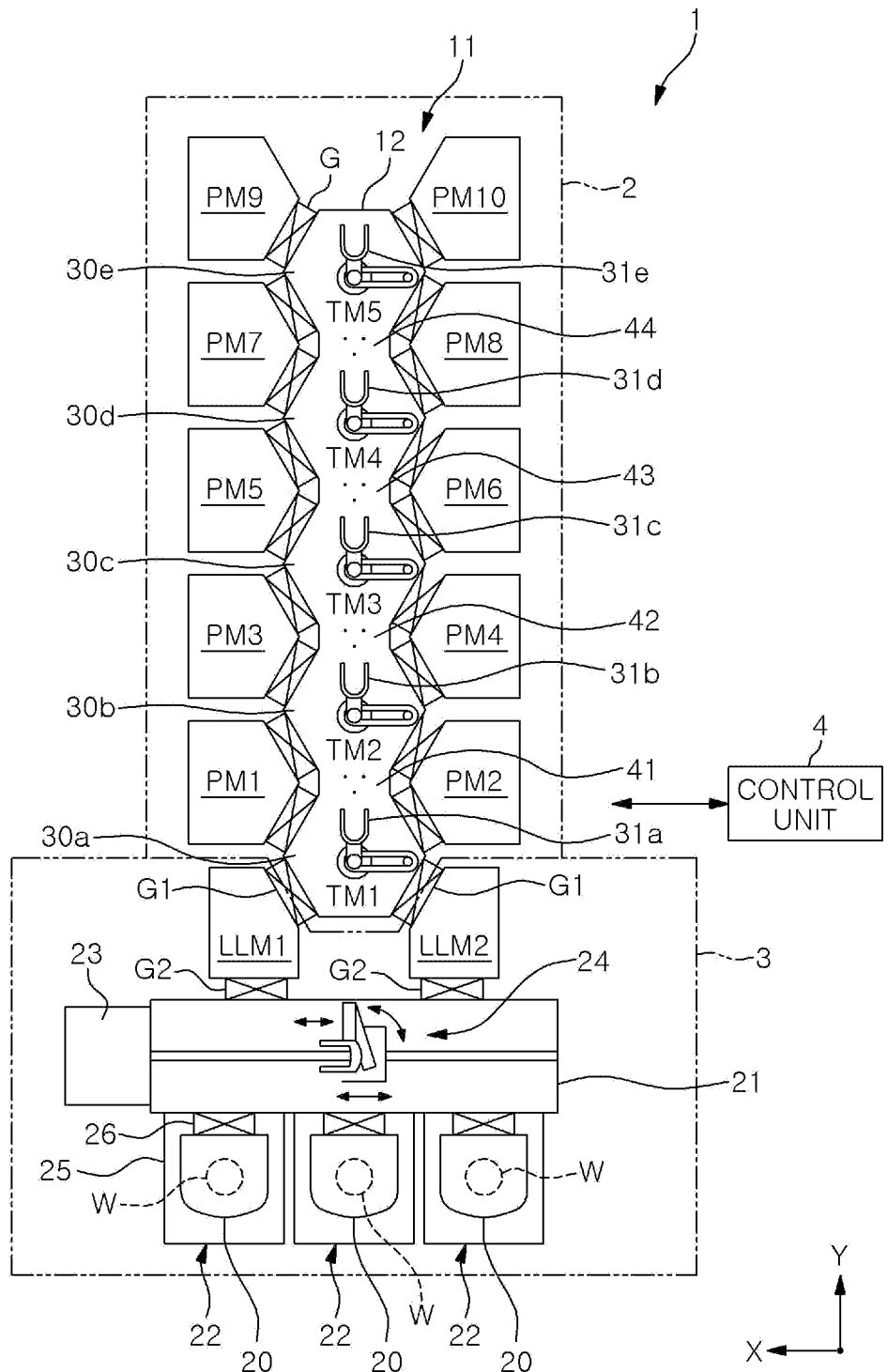
FIG. 1 is a schematic cross-sectional view showing a substrate processing system according to an embodiment.

FIG. 1 is a schematic cross-sectional view of a substrate processing system according to an embodiment.

The substrate processing system 1 includes a processing unit 2 for performing a plurality of processes on a substrate, a loading/unloading unit 3 for holding a plurality of substrates and transferring the substrates to the processing unit 2, and a control unit 4. The substrate is not particularly limited, and may be, e.g., a semiconductor wafer (hereinafter, simply referred to as "wafer"). In the following description, the case of using a wafer as a substrate will be described as an example.

The processing unit 2 includes a plurality of (ten in this example) processing modules PM1 to PM10 for performing predetermined vacuum processing on a wafer W, and a first transfer device 11 for sequentially transferring the wafer W to the processing modules PM1 to PM10. The first transfer device 11 includes a plurality of transfer modules TM1 to TM5. The transfer modules TM1 to TM5 respectively have containers 30a, 30b, 30c, 30d, and 30e, each having a hexagonal planar shape and maintained in a vacuum state, and transfer mechanisms 31a, 31b, 31c, 31d and 31e that are respectively provided in the containers 30a, 30b, 30c, 30d, and 30e and have an articulated structure. Delivery units 41, 42, 43, and 44 serving as transfer buffers are provided between the transfer mechanisms 31a to 31e of the transfer modules TM1 to TM5. The containers 30a to 30e of the transfer modules TM1 to TM5 communicate with each other and constitute one transfer chamber 12. The transfer chamber 12 extends in the Y-direction in FIG. 1. Five of the processing modules PM1 to PM10 are connected to one side of the transfer chamber 12 via openable/closable gate valves G, and the other five processing modules PM1 to PM10 are connected to the other side of the transfer chamber 12 via openable/closable gate valves G. The gate valves G of the processing modules PM1 to PM10 are opened when the transfer modules access the processing modules and are closed when the processing is performed.

The loading/unloading unit 3 is connected to one end of the processing unit 2. The loading/unloading unit 3 includes an atmosphere transfer chamber (EFEM) 21, three load ports 22 connected to the atmosphere transfer chamber 21, an aligner module 23, two load-lock modules LLM1 and LLM2, and a second transfer device 24 disposed in the atmosphere transfer chamber 21.

The atmosphere transfer chamber 21 has a rectangular parallelepiped shape of which the longitudinal direction is the X-direction in FIG. 1. The three load ports 22 are disposed on a long side of the atmosphere transfer chamber 21 that is opposite to a long side facing the processing unit 2. Each of the load ports 22 has a mounting table 25 and a transfer port 26. A front opening unified pod (FOUP) 20 that is a wafer accommodating container storing a plurality of wafers is mounted on the mounting table 25. The FOUP 20 on the mounting table 25 is connected in a sealed state to the atmosphere transfer chamber 21 via the transfer port 26.

The aligner module 23 is connected to one short side of the atmosphere transfer chamber 21. In the aligner module 23, the wafer W is aligned.

The two load-lock modules LLM1 and LLM2 allow the wafer W to be transferred between the atmospheric transfer chamber 21 in an atmospheric pressure state and the transfer chamber 12 in a vacuum state. The pressure is variable between the atmospheric pressure and the vacuum level that is similar to that in the transfer chamber 12. Each of the two load-lock modules LLM1 and LLM2 has two transfer ports. One of the transfer ports is connected to the long side of the atmospheric transfer chamber 21 that faces the processing unit 2 via a gate valve G2. The other transfer port is connected to the transfer chamber 12 of the processing unit 2 via a gate valve G1. The load-lock module LLM1 is used for transferring the wafer W from the loading/unloading unit 3 to the processing unit 2, and the load-lock module LLM2 is used for transferring the wafer W from the processing unit 2 to the loading/unloading unit 3. Further, processing such as degassing or the like may be performed in the load-lock modules LLM1 and LLM2.

The second transfer device 24 in the atmosphere transfer chamber 21 has an articulated structure and transfers the wafer W to the FOUP 20 on the load port 22, the aligner module 23, and the load-lock modules LLM1 and LLM2. Specifically, the second transfer device 24 takes out an unprocessed wafer W from the FOUP 20 on the load port 22 and transfers the wafer W to the aligner module 23 and then from the aligner module 23 to the load-lock module LLM1. Further, the second transfer device 24 receives a processed wafer W transferred from the processing unit 2 to the load-lock module LLM2 and transfers the processed wafer W to the FOUP 20 on the load port 22. Although FIG. 1 shows an example in which the second transfer device 24 has one pick for receiving the wafer W, two picks may be provided.

The first transfer device 11 and the second transfer device 24 constitute a transfer unit of the substrate processing system 1.

In the processing unit 2, the processing modules PM1, PM3, PM5, PM7, and PM9 are arranged on one side of the transfer chamber 12 in that order from the load-lock module LLM1 side, and the processing modules PM2, PM4, PM6, PM8 and PM10 are arranged on the other side of the transfer chamber 12 in that order from the load-lock module LLM2 side. In the first transfer device 11, the transfer modules TM1, TM2, TM3, TM4, and TM5 are arranged in that order from the load-lock modules LLM1 and LLM2 side.

The transfer mechanism 31a of the transfer module TM1 can access the load-lock modules LLM1 and LLM2, the processing modules PM1 and PM2, and the delivery unit 41. The transfer mechanism 31b of the transfer module TM2 can access the processing modules PM1, PM2, PM3, and PM4, and the delivery units 41 and 42. The transfer mechanism 31c of the transfer module TM3 can access the processing modules PM3, PM4, PM5, and PM6, and the delivery units 42 and 43. The transfer mechanism 31d of the transfer module TM4 can access the processing modules PM5, PM6, PM7, and PM8, and the delivery units 43 and 44. The transfer mechanism 31e of the transfer module TM5 can access the processing modules PM7, PM8, PM9, and PM10, and the delivery unit 44.

Figure 2:
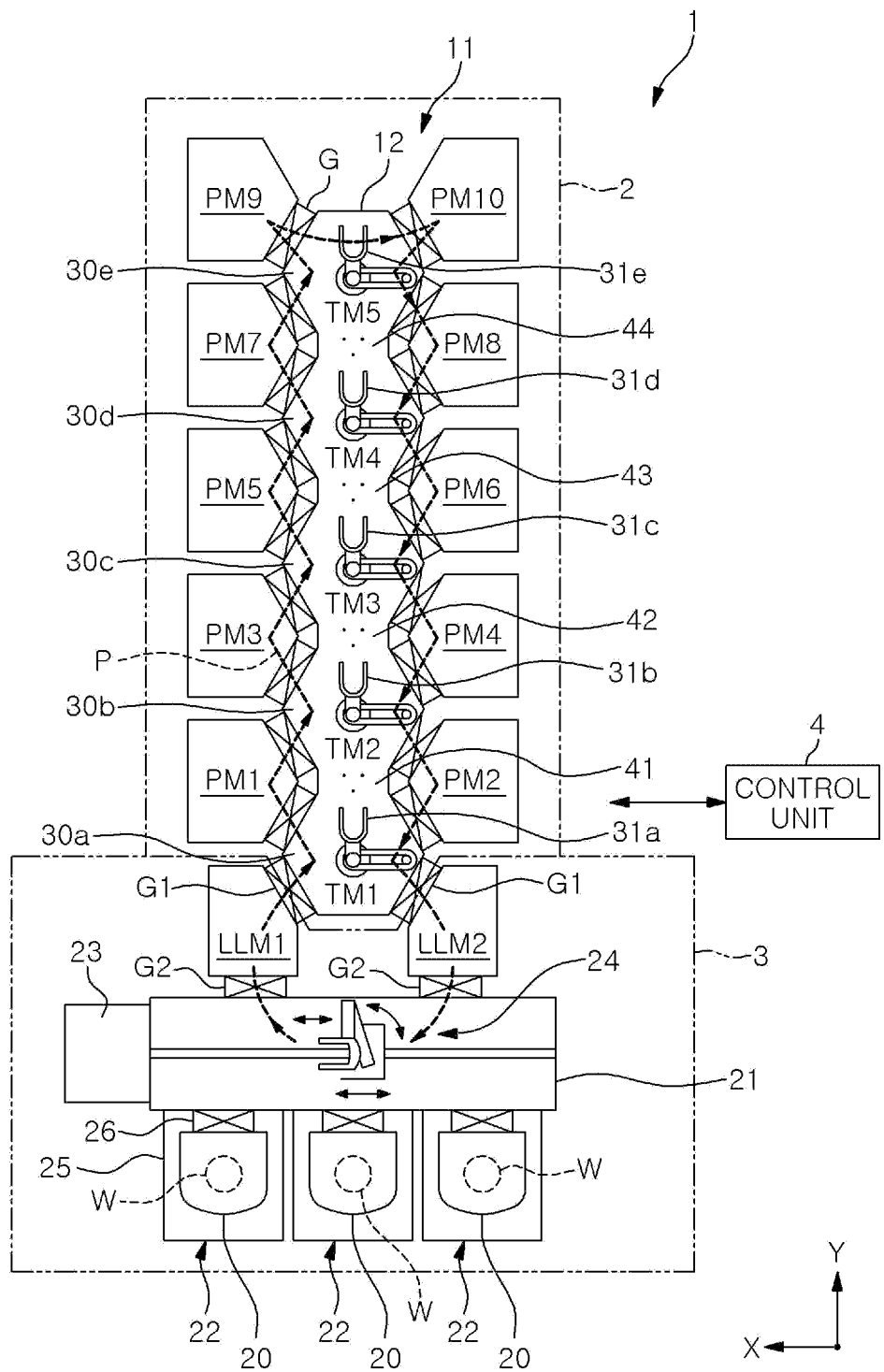
FIG. 2 is a schematic cross-sectional view showing a substrate transfer path in the substrate processing system according to the embodiment.

Since the transfer modules TM1 to TM5 of the first transfer device 11 and the second transfer device 24 are configured as described above, the wafer W unloaded from the FOUP 20 is serially transferred in one direction along a substantially U-shaped path P in the processing unit 2, processed in the respective processing modules, and returned to the FOUP 20, as shown in FIG. 2. In other words, the wafer W is transferred to the processing modules PM1, PM3, PM5, PM7, PM9, PM10, PM8, PM6, PM4, and PM2 in that order and subjected to a predetermined processing in the respective processing modules.

The processing system 1 can be used for manufacturing a laminated film (MTJ film) used in a magnetoresistive random access memory (MRAM), for example. The MTJ film is manufactured by a plurality of processes such as a pre-cleaning process, a film forming process, an oxidation process, a heating process, a cooling process, and the like. These processes are performed in the processing modules PM1 to PM10. At least one of the processing modules PM1 to PM10 may be a standby module that allows the wafer W to be on standby.

Figure 3:
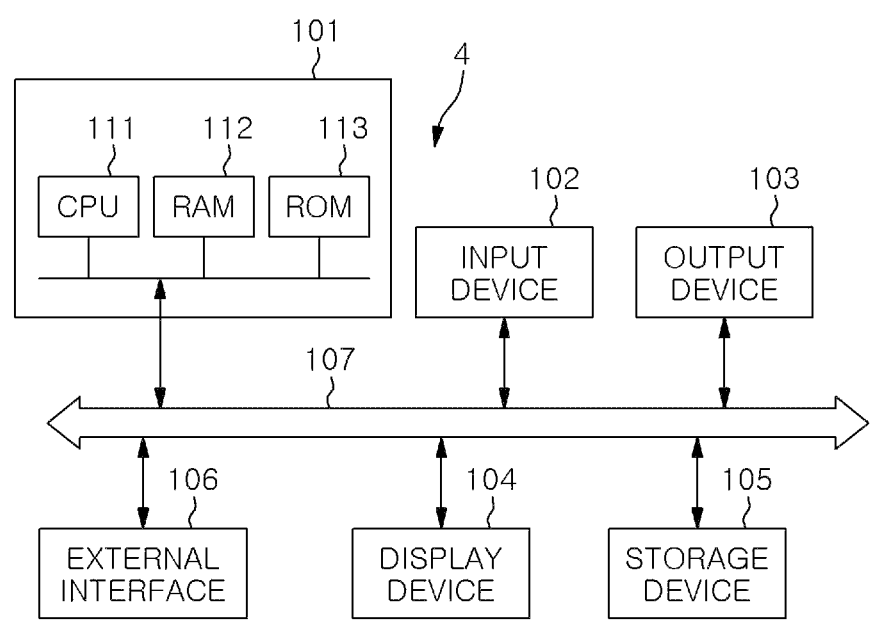
FIG. 3 is a block diagram showing an example of a hardware configuration of a control unit in the substrate processing system according to the embodiment.

The control unit 4 controls the respective components of the substrate processing system 1, e.g., the transfer modules TM1 to TM5 (transfer mechanisms 31a to 31e), the second transfer device 24, the processing modules PM1 to PM10, the load-lock modules LLM1 and LLM2, the transfer chamber 12, the gate valves G, G1, G2, and the like. The control unit 4 is typically a computer. FIG. 3 shows an example of a hardware configuration of the control unit 4. The control unit 4 includes a main control unit 101, an input device 102 such as a keyboard, a mouse, or the like, an output device 103 such as a printer or the like, a display device 104, a storage device 105, an external interface 106, and a bus 107 that connects these components to one another. The main control unit 101 includes a central processing unit (CPU) 111, a RAM 112, and a ROM 113. The storage device 105 is configured to record and read out information required for control. The storage device 105 includes a computer-readable storage medium storing a processing recipe for the wafer W, or the like.

In the control unit 4, the CPU 111 executes the program stored in the storage medium of the ROM 113 or the storage device 105 using the RAM 112 as a work area, thereby causing the substrate processing system 1 to process the wafer W as a substrate.

Figure 4:
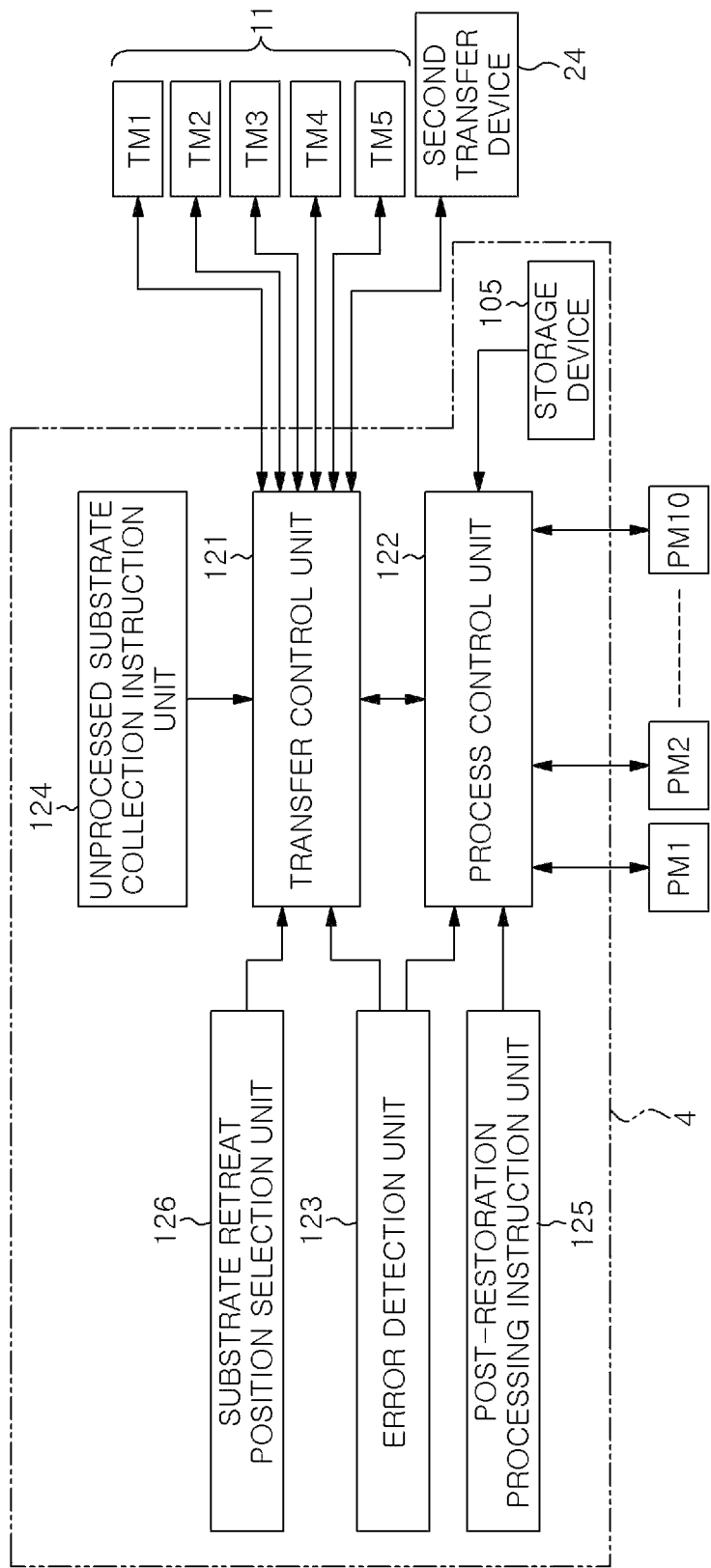
FIG. 4 is a functional block diagram of the control unit in the substrate processing system according to the embodiment.

FIG. 4 is a functional block diagram of the control unit 4. The control unit 4 includes a transfer control unit 121, a process control unit 122, an error detection unit 123, an unprocessed substrate collection instruction unit 124, a post-restoration processing instruction unit 125, and a substrate retreat position selection unit 126. Although the control unit 4 has a function unit other than these function units, the description thereof will be omitted.

The transfer control unit 121 controls the transfer modules TM1 to TM5 (transfer mechanisms 31*a* to 31*e*) of the first transfer device 11 and the second transfer device 24. Specifically, the wafer W as a substrate is unloaded from the FOUP 20 and transferred to the processing unit 2 through the aligner module 23 and the load-lock module LLM1. Then, the wafer W is sequentially transferred to the respective processing modules and returned to the FOUP 20 through the load-lock module LLM2.

The process control unit 122 controls the processing of the processing modules PM1 to PM10 based on the processing recipe stored in the storage medium of the storage device 105. The processing modules PM1 to PM10 have individual controllers, and the process control unit 122 controls the processing modules PM1 to PM10 using these controllers.

If an error occurs during execution of a processing recipe of a certain processing module, the error detection unit 123 detects the error and notifies the transfer control unit 121 and the process control unit 122 of the error. When the error is notified, the control unit 4 operates in an error occurrence mode.

In the error occurrence mode, the unprocessed substrate collection instruction unit 124 is activated. The unprocessed substrate collection instruction unit 124 is displayed as an unprocessed substrate collection screen on the display device 104, and the transfer control unit 121 issues an unprocessed wafer collection instruction by pressing "OK" on the unprocessed substrate collection screen. The second transfer device 24 and the transfer mechanism 31*a* of the transfer module TM1 are controlled based on this instruction such that wafers W that have been unloaded from the load port 22 (FOUP 20) but have not been processed can be collected in the FOUP 20. The unprocessed wafers W exist at the loading/unloading unit 3, on the second transfer device 24, in the aligner module 23, and in the load-lock chamber LLM1.

The transfer control unit 121 and the process control unit 122 control the processing module and the transfer unit such that the processing of the preceding wafer that has passed through the processing module in which the error has occurred can be continued.

After predetermined restoration processing such as initialization of a unit or the like is performed, the post-restoration processing instruction unit 125 is activated. The post-restoration processing instruction unit 125 is displayed as an operation button on a post-restoration processing management screen displayed on the display device 104 at the time of error occurrence. By pressing the operation button, the process control unit 122 and the transfer control unit 121 issue an instruction for performing the following processes required after the restoration:

(1) Instruction for storing a processing recipe execution status at the time of error occurrence in the storage device 105 and temporarily interrupting the execution of the processing recipe;

(2) Instruction for retreating an error wafer;

(3) Instruction for continuing processing of a subsequent wafer;

(4) Instruction for performing re-execution (recovery) after restoration of the error wafer; and (5) Instruction for performing remaining processing on the error wafer after the recovery in the processing modules.

The post-restoration processing management screen is used for managing post-restoration processing such as re-execution (recovery) after the restoration, or the like. For example, a retreated error wafer is managed, and a state of an error wafer or navigation of a restoration procedure is displayed.

After the operation of the post-restoration processing instruction unit 125 is carried out, the substrate retreat position selection unit 126 is activated. The substrate retreat position selection unit 126 is displayed as a substrate retreat position selection screen on the post-restoration processing management screen of the display device 104. By selecting a predetermined position from the positions to which the wafer can be retreated displayed on the substrate retreat position selection screen, the transfer control unit 121 causes the transfer module to retreat the error wafer. The retreat position may be the delivery units 41 to 44 and/or a processing module used as a standby module among the processing modules PM1 to PM10.

Even when a plurality of error wafers is generated, it is possible to retreat the wafers and perform re-execution (recovery) as long as the retreat position exists.

The process control unit 122 has therein a timer. The timer measures, for each processing module, time elapsed from the occurrence of the error of the processing recipe. The process control unit 122 manages the time after the error occurrence based on the measurement value of the timer. When the wafer undergoing processing is left for a long period of time, the characteristics of the devices formed on the wafer are affected. Therefore, a recovery timeout after the error occurrence is set, for each processing module, as a time to save a wafer after the error occurrence.

A history at the time of re-execution (recovery) of the error wafer is stored as log information in the storage device 105 and is managed on a screen dedicated to the error wafer. On this screen, a wafer of which the time from the error occurrence to the recovery exceeded the recovery timeout is marked with a timeout flag.

A status corresponding to a result obtained by executing the processing recipe in each processing module is displayed on the status display screen. At this time, the status displays re-execution if re-execution is performed and the status displays timeout if timeout occurred at the time of re-execution.

Next, the operations in the substrate processing system 1 configured as described above will be described. The following operations are performed under the control of the control unit 4.

First, the wafer W as a substrate is unloaded from the FOUP 20 on the load port 22 and transferred to the aligner module 23 by the second transfer device 24. The wafer W is aligned in the aligner module 23 and then transferred from the aligner module 23 to the load-lock module LLM1 by the second transfer device 24. At this time, the load-lock module LLM1 is in an atmospheric pressure state. After the wafer W is received, the load-lock module LLM1 is evacuated.

Next, the wafer W is unloaded from the load-lock module LLM1 and transferred to the processing module PM1 by the transfer mechanism 31*a* of the transfer module TM1 in the first transfer device 11. Then, the wafer W is subjected to a predetermined processing in the processing module PM1. Thereafter, the wafer W is sequentially transferred to the processing modules PM3, PM5, PM7, PM9, PM10, PM8, PM6, PM4, and PM2 by the transfer mechanisms 31a to 31e of the transfer modules TM1 to TM5 and sequentially subjected to predetermined processing in the processing modules.

After the processing of the wafer W in the processing module PM2 is completed, the wafer W is transferred to the load-lock module LLM2 by the transfer mechanism 31a of the transfer module TM1. At this time, the load-lock module LLM2 is in a vacuum state. After the wafer W is received, the load-lock module LLM2 is released to the atmosphere.

Thereafter, the wafer W in the load-lock module LLM2 is transferred into the FOUP 20 on the load port 22 by the second transfer device 24.

The above-described processes are repeatedly performed on a plurality of wafers W.

In a substrate processing system for serially transferring a substrate to a plurality of processing modules and sequentially processing the substrate, an expensive substrate such as a wafer for MRAM or the like is used. Therefore, if an error occurs in a certain processing module, recovery is attempted to improve the product yield. In this substrate processing system, when an error occurs in a predetermined processing module, the entire processing cannot be continued without the recovery of the error wafer. In other words, a subsequent wafer waits to be processed during the recovery of the error wafer. The preceding wafer that is not affected by the processing module can be processed without a problem. However, the preceding wafer also waits to be processed because, e.g., the atmospheric transfer device is being used by the subsequent wafer.

The processing characteristics of a wafer in a standby state during the processing may be adversely affected and result in a defective wafer. Since the wafer used for the processing is expensive as described above, the generation of a defective wafer leads to a large loss.

Figure 5:
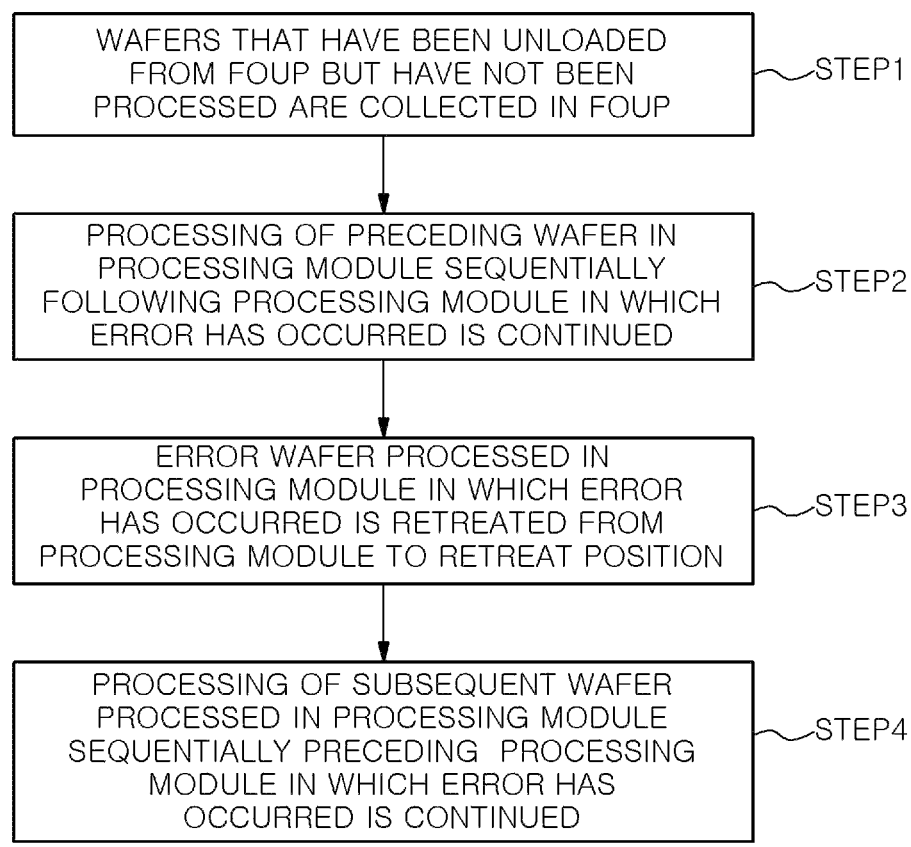
FIG. 5 is a flowchart of a substrate processing method according to the embodiment.

Therefore, in the embodiment, when an error occurs during execution of a processing recipe of a certain processing module, the control unit 4 executes steps 1 to 4 shown in the flowchart of FIG. 5. In step 1, wafers W that have been unloaded from the FOUP 20 but have not been processed are collected in the FOUP 20. In step 2, the processing of the preceding wafer in the processing module sequentially following the processing module in which the error has occurred is continued. In step 3, the error wafer processed in the processing module in which the error has occurred is retreated from the processing module to the retreat position. In step 4, the processing of the subsequent wafer processed in the processing module sequentially preceding the processing module in which the error has occurred is continued.

Therefore, when the error has occurred, the other wafers except the error wafer among the wafers (substrates) processed by the substrate processing system 1 can be quickly processed and saved. Accordingly, the generation of defective substrates can be suppressed.

Figure 6:
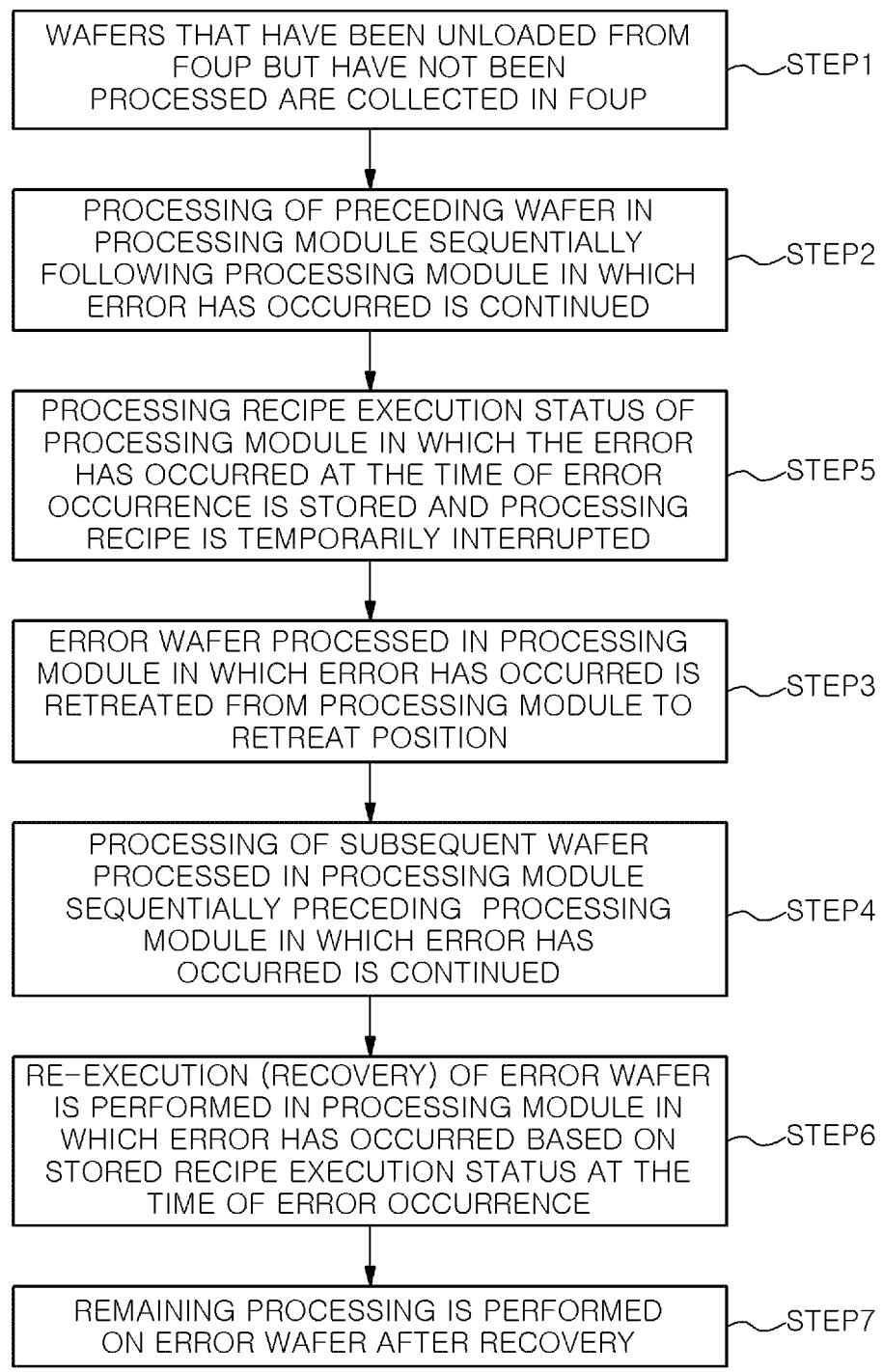
FIG. 6 is a flowchart of a substrate processing method according to another embodiment.

In another embodiment, when an error has occurred during execution of a processing recipe of a certain processing module, the control unit 4 executes steps 5 to 7 in addition to steps 1 to 4, shown in the flowchart of FIG. 6. In step 5, between step 2 and step 3, the processing recipe execution status of the processing module in which the error has occurred at the time of error occurrence is stored and the execution of the processing recipe is temporarily interrupted. In step 6, subsequent to step 4, the re-execution (recovery) of the error wafer is performed in the processing module in which the error has occurred based on the stored recipe execution status at the time of error occurrence. In step 7, the remaining processing is performed on the error wafer after the recovery.

Accordingly, the recipe status at the time of error occurrence is stored for the error wafer, and other normal wafers are processed. Next, the processing after the error occurrence is re-executed (recovered) and, thus, the error wafer can be saved.

This will be described in detail below.

Figure 7:
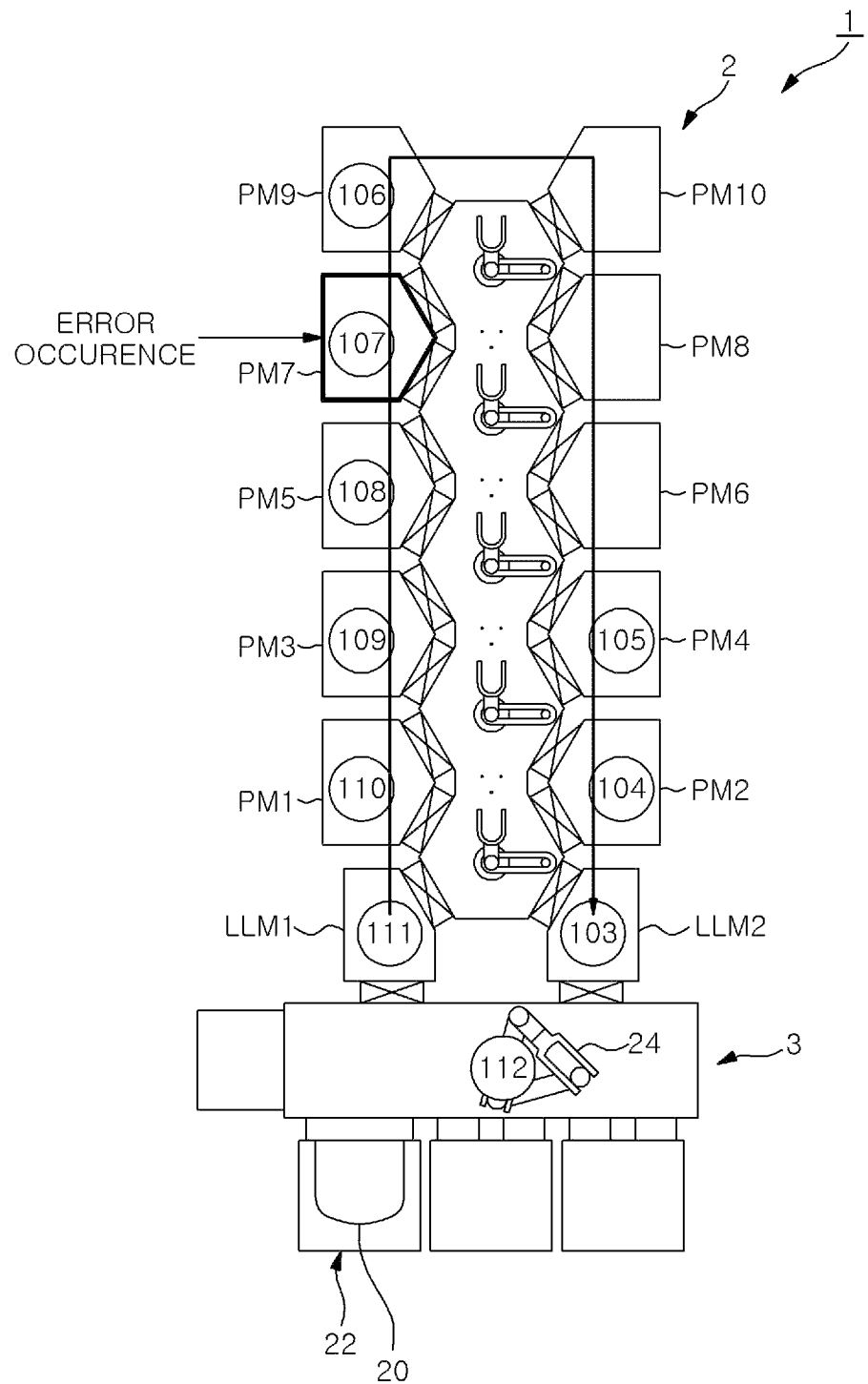
FIG. 7 schematically shows a state of a substrate processing system 1 in the case where an error has occurred during execution of a processing recipe of a processing module PM7.

Here, a case in which an error has occurred during the execution of the processing recipe of the processing module PM7 at the time of processing a plurality of wafers W (substrates) in the substrate processing system 1 will be described as an example. FIG. 7 schematically shows a state of the substrate processing system 1 at that time.

FIG. 7 shows a state in which an error has occurred during the execution of the processing recipe of the processing module PM7 in a state where ten wafers W from No. 103 to 112 extracted from the FOUP 20 exist in the substrate processing system 1. The error occurrence is detected by the error detection unit 123, and notified to the transfer control unit 121 and the process control unit 122. When the error is notified, the control unit 4 operates in an error occurrence mode.

Figure 8:
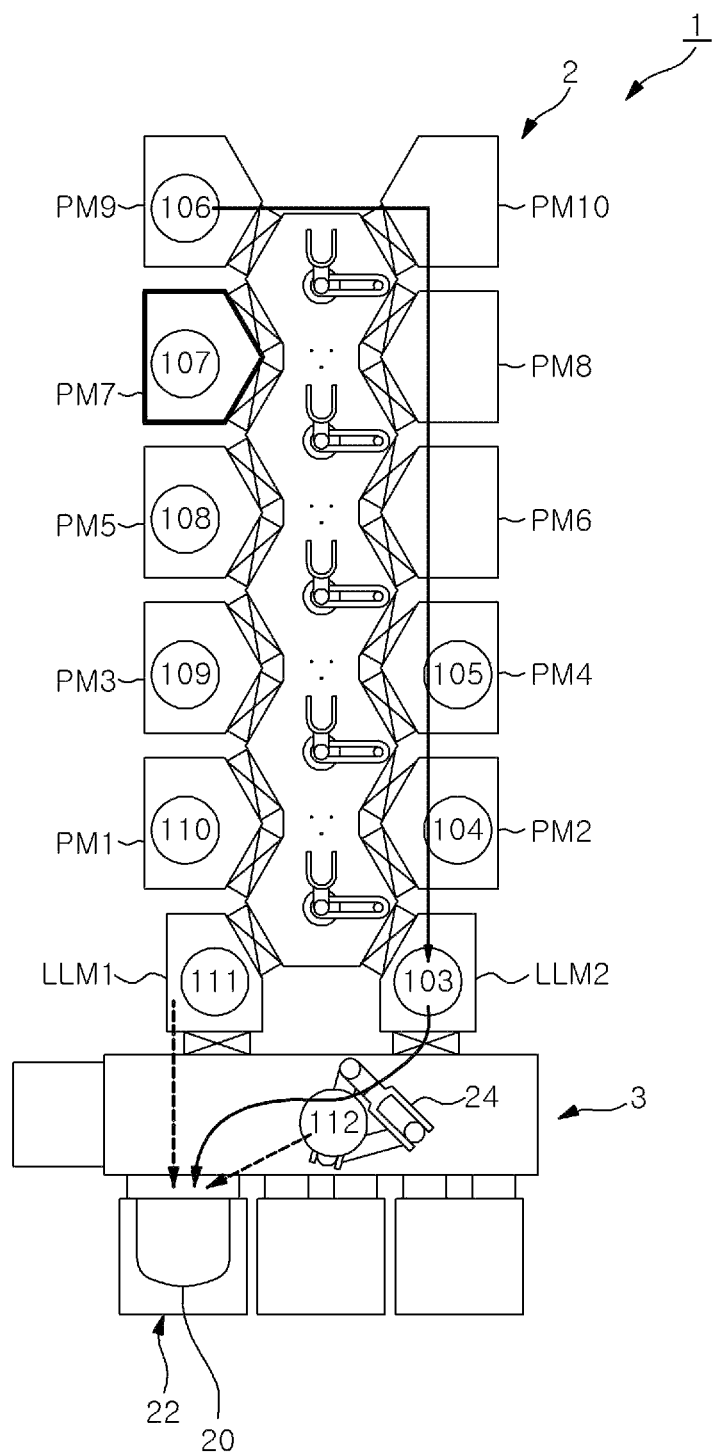
FIG. 8 schematically shows a state of the substrate processing system 1 after an unprocessed wafer is collected and a preceding wafer is processed.

In that state, steps 1 and 2 are executed as shown in FIG. 8.

In step 1, when the operator presses "OK" on the unprocessed substrate collection screen forming the unprocessed substrate collection instruction unit 124, the transfer control unit 121 issues an unprocessed wafer collection instruction. Based on this instruction, wafers W that have been unloaded from the load port 22 (FOUP 20) but have not been processed, i.e., wafers W (No. 111 and 112) in the loading/unloading unit 3, are collected in the FOUP 20. The unprocessed wafers have not been subjected to the processing that adversely affects processing characteristics, and thus are collected and subjected to normal processing after the error is processed.

In step 2, the transfer control unit 121 and the process control unit 122 continue the processing of the preceding wafers W (No. 103, 104, 105 and 106) that have passed through the processing module in which the error has occurred. Since the unprocessed wafers are collected, the second transfer device 24 can be used for transferring the wafer W that is processed, and there is no stagnation of the wafer W.

Next, after predetermined restoration processing such as initialization of a unit or the like is performed, an operation button for the post-restoration processing instruction on the screen of the display device 104 displayed at the time of error occurrence, which constitutes the post-restoration processing instruction unit 125, is pressed. Accordingly, steps 5, 3, 4, 6, and 7 are executed by the instruction from the process control unit 122 and the transfer control unit 121.

In step 5, the processing recipe execution status at the time of error occurrence (e.g., an execution recipe, an interrupted step, an execution time of the interrupted step, and information on control job (CJ)/process job (PJ)) is stored in the storage device 105, and the processing recipe is temporarily interrupted.

Since the recipe execution status at the time of error occurrence is stored not in the controller of the processing module but in the storage device 105 of the control unit 4 for controlling the entire substrate processing system 1, the memory is not lost even if the power to the processing module in which the error has occurred is shut off.

Figure 9:
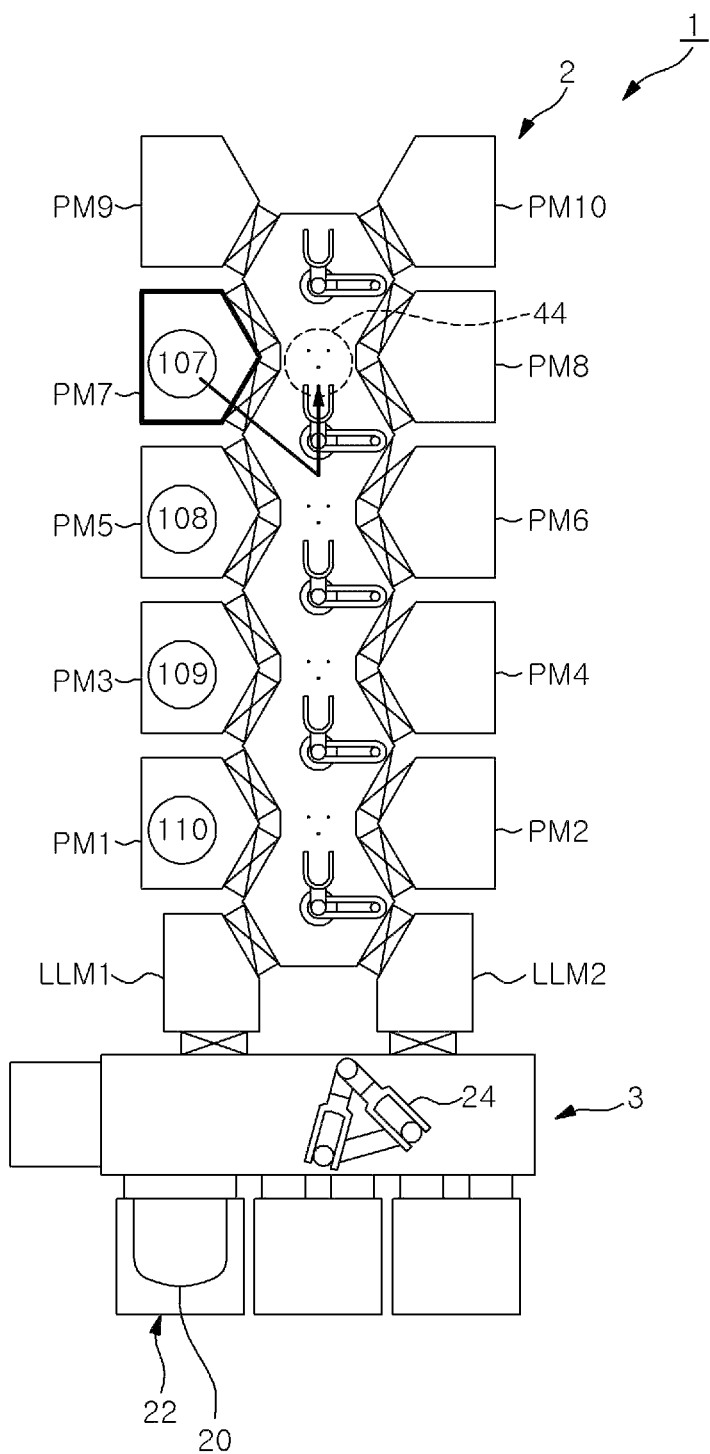
FIG. 9 schematically shows a state of the substrate processing system 1 in the case where an error wafer is retreated to a retreat position.

In step 3, the retreat position is selected from positions to which the wafer can be retreated on the substrate retreat position selection screen displayed on the display device 104 that constitutes the substrate retreat position selection unit 126. Accordingly, as shown in FIG. 9, the error wafer (No. 107) processed in the processing module PM7 in which the error has occurred is retreated to the retreat position (the delivery unit 44 in this example).

Figure 10:
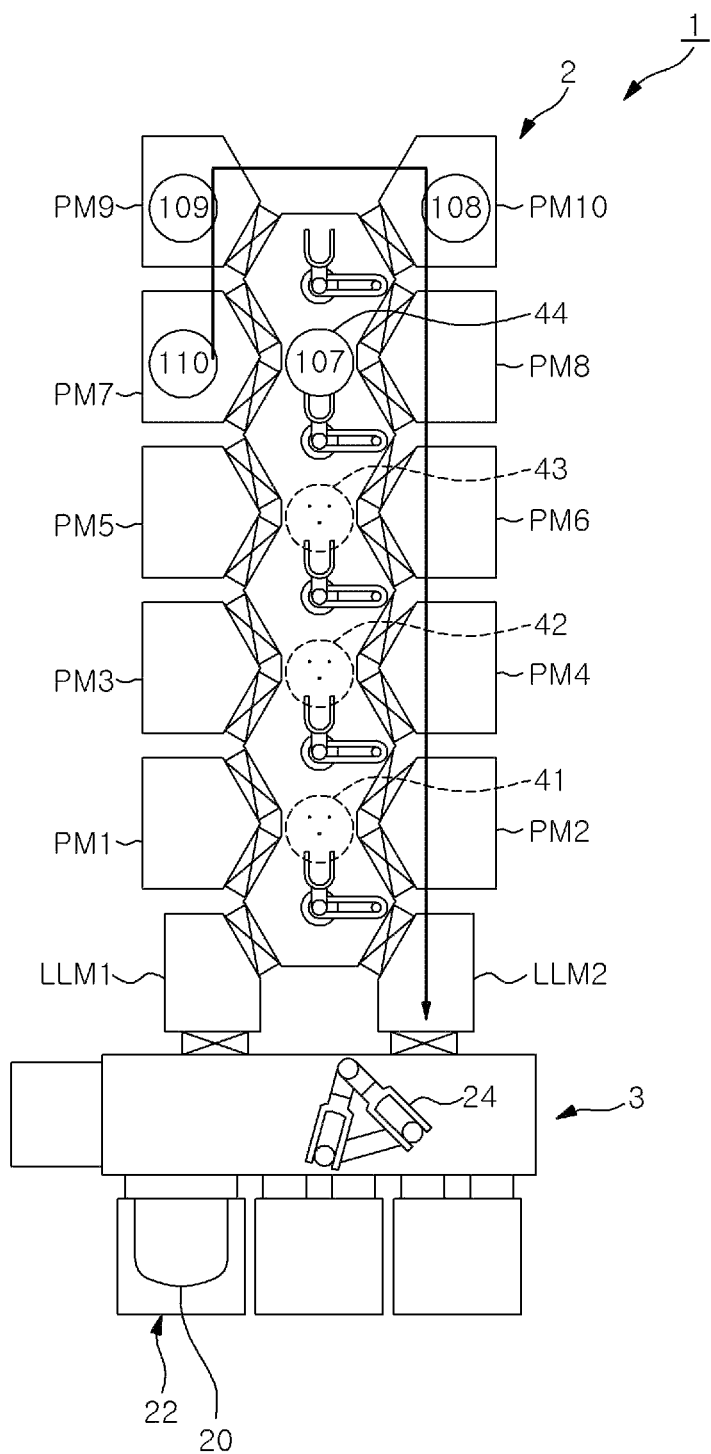
FIG. 10 schematically shows a state of the substrate processing system 1 in the case where processing of a subsequent wafer in a previous processing module of the processing module PM7 in which an error has occurred is continued.

When the retreat of the error wafer is completed as normal, the scheduled transfer process of the error wafer is suspended, and step 4 is executed. In step 4, as shown in FIG. 10, the processing of subsequent wafers (No. 108, 109, and 110) processed in the processing modules PM1, PM3, and PM5, which precede the processing module PM7 in which the error has occurred, is continued. At this time, the subsequent wafers are transferred as normal prior to the error wafer and subjected to routine processing.

In step 6, subsequent to step 4, the interrupted processing due to the error is re-executed (recovered) on the error wafer (No. 107) based on the stored recipe execution status at the time of error occurrence in the processing module PM7 in which the error has occurred. In step 7, the remaining processing is performed on the recovered error wafer in each processing module.

Figure 11:
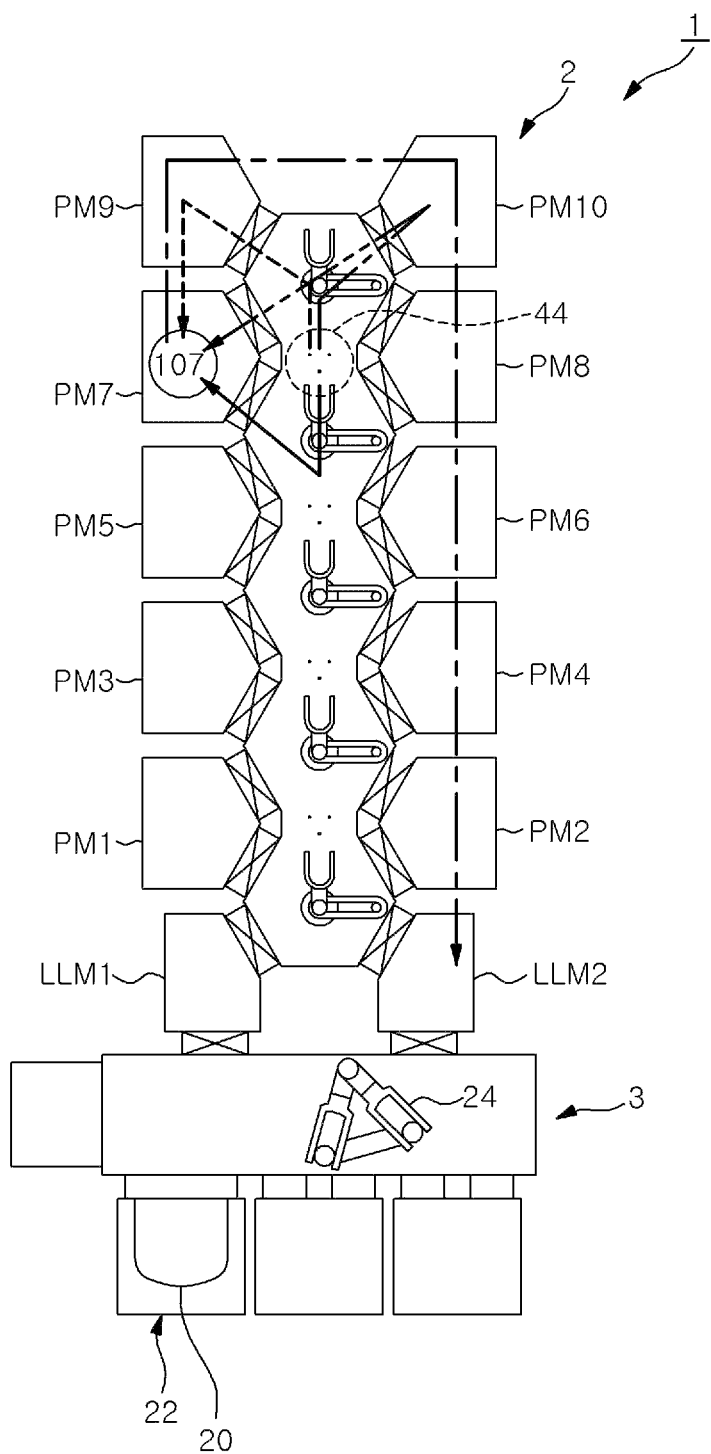
FIG. 11 schematically shows a state of the substrate processing system in the case where re-execution (recovery) of an error wafer and remaining processing after the recovery is performed.

FIG. 11 shows the execution status of steps 6 and 7.

In step 6, the re-execution (recovery) of the error wafer is manually performed. In other words, the processing module PM7 in which the error has occurred is restored to a normal state and, then, the operator selects the re-execution of the error wafer on the management screen to transfer the error wafer from the retreat position to the processing module PM7 in which the error has occurred. Then, by resuming the processing recipe from the error interruption state in the processing module PM7, the re-execution (recovery) of the error wafer is executed.

However, when the error wafer is in the standby state, the processing conditions such as temperature in the atmosphere and the like may be changed. Therefore, if necessary, pre-processing such as heat treatment, e.g., heating or cooling, is manually performed before the re-execution (recovery) in the processing module PM7. The pre-processing is performed when the operator selects the pre-processing on the management screen. FIG. 11 shows an example in which the error wafer (No. 107) is subjected to re-execution (recovery) in the processing module PM7 without pre-processing and an example in which the re-execution (recovery) in the processing module PM7 is executed after the pre-processing in the processing module PM9 or PM10.

In step 7, the recovered error wafer is transferred to, e.g., the processing modules PM9, PM10, PM8, PM6, PM4, and PM2, along the normal transfer path and subjected to the remaining processing.

As described above, when an error has occurred during execution of a processing recipe of a certain processing module, wafers except the error wafer among the wafers processed in the substrate processing system 1 can be quickly processed and saved. Therefore, the generation of defective substrates can be suppressed.

The recipe status at the time of error occurrence is stored for the error wafer, and other normal wafers are processed. Next, the processing after the error occurrence is re-executed (recovered) on the error wafer and, thus, the error wafer can be saved.

In the present embodiment, for each processing module, the time from the error occurrence is measured and a recovery timeout after the error occurrence is set as the time to save a wafer after the error occurrence. Then, the history of re-execution (recovery) of the error wafer is managed on the screen, and the wafer with a neglect time exceeds the recovery timeout is marked with a timeout flag and displayed on the management screen. Further, the status display screen displays thereon the status corresponding to the result obtained when the processing recipe is executed in each processing module, and the status display includes the execution of the recovery and the occurrence of the recovery timeout. Therefore, when the operator performs re-execution (recovery) of the error wafer, it is possible to check whether or not the resting time of the error wafer exceeds the recovery timeout. In addition, it is possible to check whether or not the processed wafer was recovered and whether or not recovery timeout has occurred.

In vacuum processing such as a MRAM manufacturing process or the like, and in processing that depends on a temperature or the like, if a wafer undergoing processing is left for a long period of time, the characteristics of the devices formed on the wafer are affected. Therefore, as described above, it is important to check whether or not the neglect time of the error wafer exceeds the recovery timeout in determining whether or not the wafer after the re-execution (recovery) can be used.

If the re-execution (recovery) of the error wafer is not executed, steps 5, 6 and 7 are not required. Even in that case, other wafers except the error wafer can be quickly processed and saved.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

For example, the processing system 1 of the embodiment is merely an example, and any processing system may be used as long as the substrate can be sequentially and serially transferred to and processed in a plurality of processing modules. Further, although the manufacturing of the MTJ film of the MRAM has been described as an example of the processing, the present invention is not limited thereto.

The above-described embodiments have described the case where the re-execution (recovery) and the remaining processing in the subsequent processing modules are performed on the substrate marked with the recovery timeout flag. However, the re-execution (recovery) and the remaining processing may not be performed on the wafer marked with the recovery timeout flag.

What is claimed is:

1. A substrate processing system for processing a plurality of substrates, comprising:
   a processing unit including a plurality of processing modules configured to perform predetermined processing and a first transfer device configured to transfer a substrate to the processing modules;
   a loading/unloading unit including a load port configured to hold a substrate accommodating container accommodating a plurality of substrates and a second transfer device configured to load/unload a substrate to/from the processing unit; and
   a control unit configured to control the processing modules, the first transfer device, and the second transfer device, wherein the control unit is configured to control the substrates to be sequentially and serially transferred to the processing modules, and wherein, when an error has occurred in a certain processing module, the control unit executes:

collecting a substrate, that has been unloaded from the substrate accommodating container but has not been processed, in the substrate accommodating container;

continuing processing of a preceding substrate in a processing module sequentially following the processing module in which the error has occurred;

retreating an error substrate processed in the process module in which the error has occurred from the processing module to a retreat position; and continuing processing of a subsequent substrate processed in a processing module sequentially preceding the processing module in which the error has occurred, wherein the control unit is further configured to:
measure a time after the error occurrence,
set, for each of the processing modules, a recovery timeout as a time to save a wafer after the error occurrence, and
add a timeout flag to the error substrate for which neglect time from the error occurrence to the re-execution exceeds the recovery timeout.

2. The substrate processing system of claim 1, wherein the control unit further executes:

storing, before said retreating the error substrate from the processing module to the retreat position, a processing recipe execution status of the processing module in which the error has occurred at the time of error occurrence and temporarily interrupting the processing recipe;

re-executing, after said continuing the processing of the subsequent substrate, a processing of the processing module in which the error has occurred on the error substrate based on the recipe execution status at the time of error occurrence; and performing remaining processing on the error substrate after the re-execution in subsequent processing modules.

3. The substrate processing system of claim 2, wherein the control unit performs said re-executing in the processing module in which the error has occurred.

4. The substrate processing system of claim 2, wherein the control unit performs a required preprocessing on the error substrate before said re-executing.

5. The substrate processing system of claim 4, wherein the control unit performs the preprocessing in a processing module different from the processing module in which the error has occurred.

6. The substrate processing system of claim 1, wherein the first transfer device includes a plurality of transfer mechanisms arranged along an arrangement direction of the processing modules, and one or more delivery units provided between the transfer mechanisms to deliver a substrate, wherein the delivery units are used as the retreat position of the error substrate.

7. The substrate processing system of claim 1, wherein a processing module other than the processing module in which the error has occurred is used as the retreat position of the error substrate.

8. The substrate processing system of claim 1, wherein the processing modules of the processing unit perform processing in a vacuum state, and the loading/unloading unit further includes an aligner module configured to align a substrate and a load-lock module of which pressure is variable between an atmospheric pressure and a vacuum level, wherein, when the unprocessed substrates are collected in the substrate accommodating container, the control unit controls a substrate on the second transfer device, a substrate in the aligner module, and a substrate in the load-lock module to be collected.

9. A substrate processing method for sequentially transferring a plurality of substrates to a plurality of processing modules from a substrate accommodating container accommodating the substrates and processing the substrates, the substrate processing method comprising, when an error has occurred in a certain processing module:

collecting substrates, that have been unloaded from the substrate accommodating container but have not been processed, in the substrate accommodating container;

continuing processing of a preceding substrate in a processing module sequentially following the processing module in which the error has occurred;

retreating an error substrate processed in the processing module in which the error has occurred from the processing module to a retreat position;

continuing processing of a subsequent substrate processed in a processing module sequentially preceding the processing module in which the error has occurred;

measuring a time after the error occurrence;

setting a recovery timeout, for each of the processing modules, as a time to save a wafer after the error occurrence; and adding a timeout flag to the error substrate of which neglect time from the error occurrence to the re-execution exceeds the recovery timeout.

10. The substrate processing method of claim 9, further comprising:

storing, before said retreating the error substrate from the processing module in which the error has occurred to the retreat position, a processing recipe execution status of the processing module in which the error has occurred at the time of error occurrence and temporarily interrupting the processing recipe;

re-executing, after said continuing the processing of the subsequent substrate, a processing of the processing module in which the error has occurred on the error substrate based on the recipe execution status at the time of error occurrence; and performing remaining processing on the error substrate after the re-execution in subsequent processing modules.

11. The substrate processing method of claim 10, wherein said re-executing is performed in the processing module in which the error has occurred.

12. The substrate processing method of claim 10, further comprising:

performing a required preprocessing on the error substrate before said re-executing.

13. The substrate processing method of claim 12, wherein the preprocessing is performed in a processing module different from the processing module in which the error has occurred.

14. A computer storing a control program which when executed controls a substrate processing system for sequentially transferring a plurality of substrates from a substrate accommodating container accommodating the substrates to a plurality of processing modules and processing the substrates, wherein the computer when executing the control program, controls the substrate processing system to sequentially and serially transfer the substrates to the processing modules and executes:

collecting substrates, that have been unloaded from the substrate accommodating container but have not been processed, in the substrate accommodating container;

continuing processing of a preceding substrate in a processing module sequentially following the processing module in which an error has occurred;

retreating an error substrate processed in the processing module in which the error has occurred from the processing module to a retreat position;

continuing processing of a subsequent substrate processed in a processing module sequentially preceding the processing module in which the error has occurred measuring time after the error occurrence;

setting for each of the processing modules a recovery timeout as a time to save a wafer after the error occurrence; and adding a timeout flag to the error substrate of which neglect time from the error occurrence to the re-execution exceeds the recovery time out.

15. The computer storing the control program of claim 14, wherein the computer executes the control program to control the substrate processing system and to further execute:

storing, before said retreating the error substrate from the processing module in which the error has occurred to the retreat position, a processing recipe execution status of the processing module in which the error has occurred at the time of error occurrence and temporarily interrupting the processing recipe;

re-executing, after said continuing the processing of the subsequent substrate, a processing of the processing module in which the error has occurred on the error substrate based on the recipe execution status at the time of error occurrence; and performing remaining processing on the error substrate after the re-execution in subsequent processing modules.

* * * * *